(12) United States Patent
Tolentino et al.

(10) Patent No.: US 9,991,185 B2
(45) Date of Patent: Jun. 5, 2018

(54) DIRECT BONDED COPPER SEMICONDUCTOR PACKAGES AND RELATED METHODS

(71) Applicant: SEMICONDUCTOR COMPONENTS INDUSTRIES, LLC, Phoenix, AZ (US)

(72) Inventors: Erik Nino Tolentino, Seremban (MY); Vemal Raja Manikam, Shah Alam (MY); Azhair Aripin, Subang Jaya (MY)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days. days.

(21) Appl. No.: 15/489,998

(22) Filed: Apr. 18, 2017

(65) Prior Publication Data
US 2017/0221792 A1 Aug. 3, 2017

Related U.S. Application Data

(62) Division of application No. 14/610,115, filed on Jan. 30, 2015, now Pat. No. 9,659,837.

(51) Int. Cl.
*H01L 23/48* (2006.01)
*H01L 23/52* (2006.01)
(Continued)

(52) U.S. Cl.
CPC .......... *H01L 23/3735* (2013.01); *H01L 21/56* (2013.01); *H01L 23/315* (2013.01);
(Continued)

(58) Field of Classification Search
CPC . H01L 2224/32145; H01L 2224/32225; H01L 2924/01029; H01L 2924/15787; H01L 2224/97; H01L 21/486
(Continued)

(56) References Cited

U.S. PATENT DOCUMENTS 6,933,593 B2 8/2005 Fissore et al.
6,989,592 B2 1/2006 Chang et al.
(Continued)

OTHER PUBLICATIONS

"Industrial Sintering Process," published online by Heraeus Materials Technology GmbH & Co. KG at least as early as Nov. 14, 2014, available online at http://heraeus-contactmaterials.com/media/webmedia_local/media/downloads/documents_am/broschures/HERAEUS_BESI_IndustrialSinteringProcess_Brochure_2013.pdf.
(Continued)

*Primary Examiner* — S. V. Clark
(74) *Attorney, Agent, or Firm* — IPTechLaw (57) ABSTRACT

A power semiconductor package includes a first direct bonded copper (DBC) substrate having a plurality of connection traces on a first face of the first DBC substrate. A plurality of die are coupled to the connection traces, each die coupled to one of the connection traces at a first face of the die. A second DBC substrate includes connection traces on a first face of the second DBC substrate. A second face of each die is coupled to one of the connection traces of the first face of the second DBC substrate. A cavity between the first face of the first DBC substrate and the first face of the second DBC substrate is filled with an encapsulating compound. Terminal pins may be coupled to connection traces on the first face of the first DBC substrate. More than two DBC substrates may be stacked to form a stacked power semiconductor package.

19 Claims, 7 Drawing Sheets

(51) Int. Cl.
*H01L 29/40* (2006.01)
*H01L 23/373* (2006.01)
*H01L 21/56* (2006.01)
*H01L 23/31* (2006.01)
*H01L 25/065* (2006.01)
*H01L 25/00* (2006.01)
*H01L 23/498* (2006.01)
*H01L 23/538* (2006.01)

(52) U.S. Cl.
CPC ...... *H01L 23/3121* (2013.01); *H01L 25/0652* (2013.01); *H01L 25/50* (2013.01); *H01L 23/49861* (2013.01); *H01L 23/5385* (2013.01); *H01L 23/5389* (2013.01); *H01L 2224/33* (2013.01)

(58) Field of Classification Search
USPC .................. 257/706, 707, 701, 762, 782
See application file for complete search history.

(56) References Cited

U.S. PATENT DOCUMENTS

| | | | | |
|---|---|---|---|---|
| 8,716,830 | B2* | 5/2014 | Poddar | H01L 24/40 257/522 |
| 2006/0151874 | A1* | 7/2006 | Milich | H01L 25/072 257/713 |
| 2013/0314870 | A1 | 11/2013 | Kwak et al. | |
| 2014/0167242 | A1* | 6/2014 | Kim | H01L 23/053 257/690 |
| 2014/0183716 | A1* | 7/2014 | Zommer | H01L 24/89 257/677 |
| 2015/0035170 | A1* | 2/2015 | Nikitin | H01L 23/3735 257/777 |
| 2015/0069612 | A1* | 3/2015 | Chauhan | H01L 23/3128 257/762 |
| 2016/0133533 | A1* | 5/2016 | Lin | H01L 24/83 257/766 |
| 2016/0254217 | A1* | 9/2016 | Lu | H01L 23/49568 257/675 |
| 2016/0254218 | A1* | 9/2016 | Hong | H01L 21/561 257/773 |

OTHER PUBLICATIONS

"SKiN Technology: Wire bond-free, Goodbye to Bond Wires," published online at least as early as Dec. 5, 2014 by Semikron International GmbH, available online at http://www.semikron.com/innovation-technology/construction-and-connection-technology/skin-technology.html, last visited Dec. 5, 2014.

"SKiNTER Technology," published online at least as early as Dec. 5, 2014 by Semikron International GmbH, available online at http://www.semikron.com/innovation-technology/construction-and-connection-technology/skinter-technology.html, last visited Dec. 5, 2014.

* cited by examiner

DIRECT BONDED COPPER SEMICONDUCTOR PACKAGES AND RELATED METHODS

CROSS REFERENCE TO RELATED APPLICATIONS

This application is a divisional application of the earlier U.S. Utility Patent Application to Tolentino entitled "Direct Bonded Copper Semiconductor Packages and Related Methods," application Ser. No. 14/610,115, filed Jan. 30, 2015, the disclosure of which is hereby incorporated entirely herein by reference.

BACKGROUND

1. Technical Field

Aspects of this document relate generally to semiconductor device packages. Particular aspects of this document relate to power semiconductor device packages using direct bonded copper (DBC) substrates.

2. Background Art

Semiconductor devices are often encased within (or partly within) a package prior to use. Some packages contain a single die while others contain multiple die. The package offers protection to the die, such as from corrosion, impact and other damage, and often also includes electrical leads or other components which connect the electrical contacts of the die with a motherboard or other element(s). The package may also include components configured to dissipate heat from the die into a motherboard, a heat sink, or otherwise away from the die. Direct bonded copper (DBC) substrates used in semiconductor packages generally include a ceramic plate and either one copper layer on one side of the ceramic plate or two copper layers sandwiching the ceramic plate therebetween.

SUMMARY

Implementations of power semiconductor packages may include a first direct bonded copper (DBC) substrate having a plurality of connection traces on a first face of the first DBC substrate and a plurality of die, each die comprising a first face coupled to one of the connection traces of the first face of the first DBC substrate. Implementations may also include a second DBC substrate having a plurality of connection traces on a first face of the second DBC substrate where a second face of each of the plurality of die is coupled to one of the connection traces of the first face of the second DBC substrate.

Implementations of power semiconductor packages may include one, all, or any of the following:

A plurality of terminal pins, where each terminal pin is coupled to one of the connection traces of the first face of the first DBC substrate.

The first face of each die may be coupled to the first face of the first DBC substrate using a sintering paste.

The sintering paste may be a silver sintering paste.

The second face of each die may be coupled to the first face of the second DBC substrate using a sintering paste. The sintering paste may be a silver sintering paste.

The first DBC substrate may be a double-side DBC substrate including a ceramic plate sandwiched between a first copper layer and a second copper layer, where the first copper layer includes the connection traces of the first DBC substrate.

The second DBC substrate may be a double-sided DBC substrate including a ceramic plate sandwiched between a first copper layer and a second copper layer where the first copper layer includes the connection traces of the second DBC substrate.

The power semiconductor package may include no wirebonds.

Implementations of a method of forming a power semiconductor package may include coupling a first face of each of a plurality of die with one of a plurality of connection traces of a first face of a first DBC substrate using sintering paste and coupling a second face of each of the plurality of die with one of a plurality of connection traces of a first face of a second DBC substrate using sintering paste. The method may include sintering the sintering paste using heat and pressure and filling a cavity between the first face of the first DBC substrate and the first face of the second DBC substrate with an encapsulating compound forming a power semiconductor package.

Implementations of the method may include one, all, or any of the following:

The sintering paste may be a silver sintering paste.

The encapsulating compound may be a silicone gel and wherein filling the cavity includes applying a vacuum at a first end of the cavity while dispensing the encapsulating compound at a second end of the cavity.

The method may include coupling each of a plurality of terminal pins to one of the connection traces of the first face of the first DBC substrate.

The first DBC substrate and second DBC substrate may each include a double DBC substrate including a ceramic plate sandwiched between a first copper layer and a second copper layer wherein the first copper layer of the first DBC substrate comprises the connection traces of the first DBC substrate and wherein the first copper layer of the second DBC substrate includes the connection traces of the second DBC substrate.

Implementations of a method of forming a power semiconductor package may include coupling a first face of each of a first plurality of die with one of a plurality of connection traces of a first face of a first DBC substrate using sintering paste and coupling a second face of each of the first plurality of die with one of a plurality of connection traces of a first face of a second DBC substrate using sintering paste. The method may include coupling a first face of each of a second plurality of die with one of a plurality of connection traces of a second face of the second DBC substrate using sintering paste and coupling a second face of each of the second plurality of die with one of a plurality of connection traces of a first face of a third DBC substrate using sintering paste. The method may also include sintering the sintering paste using heat and pressure, filling a first cavity between the first face of the first DBC substrate and the first face of the second DBC substrate, and filling a second cavity between the second face of the second DBC substrate and the first face of the third DBC substrate with an encapsulating compound. The method may also include coupling each of a plurality of terminal pins to one of the connection traces of the first face of the first DBC substrate to form a semiconductor package.

Implementations of a method of forming a power semiconductor package may include one, all, or any of the following:

The method may further include coupling a first face of each of a third plurality of die with one of a plurality of connection traces of a second face of the third DBC substrate using sintering paste.

The sintering paste may be a silver sintering paste.

The encapsulating compound may be a silicone gel.

The first DBC substrate and the second DBC substrate may each include a double DBC substrate including a ceramic plate sandwiched between a first copper layer and a second copper layer.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components, assembly procedures or method elements disclosed herein. Many additional components, assembly procedures and/or method elements known in the art consistent with the intended direct bonded copper semiconductor packages and related methods will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such direct bonded copper semiconductor packages and related methods, and implementing components and methods, consistent with the intended operation and methods.

Direct bonded copper (DBC) substrates are known in the semiconductor packaging industry. As used herein "direct bonded copper" and "DBC" substrates refer to substrates that include a ceramic tile/plate/portion/section/layer and have a sheet of copper bonded to one or both sides of the ceramic tile/section using a high-temperature oxidation process. The copper sheet(s) and ceramic plate are brought to a controlled temperature in a gas atmosphere containing a specified amount of oxygen—which in implementations is about thirty parts-per-million (ppm). The remainder of the gas may be, by non-limiting example, nitrogen. Such conditions allow a copper-oxygen eutectic to form at the boundary(ies) of the copper sheet(s) with the ceramic plate. The eutectic bonds with the copper sheet(s) and with the ceramic plate. Connection traces are formed in one or both of the copper sheets. Connection traces may be formed using, by non-limiting example, wet etching, plasma etching, or the like. Connection traces may be formed before or after the heating process described above. In implementations the copper layer(s) of the DBC substrate that include connection traces are coated with nickel, gold, and/or a nickel/gold alloy. In various other implementations, the copper layer(s) of the DBC substrate, whether used for connection traces or not, may be coated with other metallic and/or non-metallic materials depending on downstream processing, including the particular sintering pastes being employed.

Some DBCs that are double-sided DBCs (or, in other words, include two sheets of copper sandwiching the ceramic plate) include one copper sheet that has no connection traces, but is simply a flat plate. In such implementations the copper sheet with connection traces may be used to electrically connect one or more electrical contacts on the face(s) of die of the semiconductor package while the copper sheet without connection traces may be attached to a heat sink or spreader to draw heat away from the die, or simply may be a heat sink or spreader itself and/or may act as an electrical grounding surface for the package. The ceramic layer may be formed of, by non-limiting example, alumina ($Al_2O_3$), aluminum nitride (AlN), beryllium oxide (BeO), and the like.

In implementations of semiconductor packages disclosed herein one or more DBC substrates could be substituted with an active metal brazed (AMB) substrate or an insulated metal substrate (IMS). An AMB substrate may be formed, by non-limiting example, by soldering metal foil to a ceramic plate using solder paste in a high temperature, vacuum environment. An IMS substrate includes a metal baseplate which may be formed of, by non-limiting example, aluminum, copper, steel, or the like. A thin dielectric layer, which may be epoxy-based, electrically isolates the metal baseplate from, and also physically couples the metal baseplate to, a copper layer. In some implementations of IMS substrates, the copper layer has a thickness of thirty-five to two hundred microns. The dielectric may be thin, such as about one hundred microns, due to its limited thermal conductivity compared with the ceramics used for DBC substrates. In other versions the dielectric may include a thermal prepreg such as a ceramic or boron filled clad which has a high voltage breakthrough but low thermal resistance. IMS substrates which use a copper baseplate may have superior thermal performance to those with an aluminum baseplate.

Figure 12:
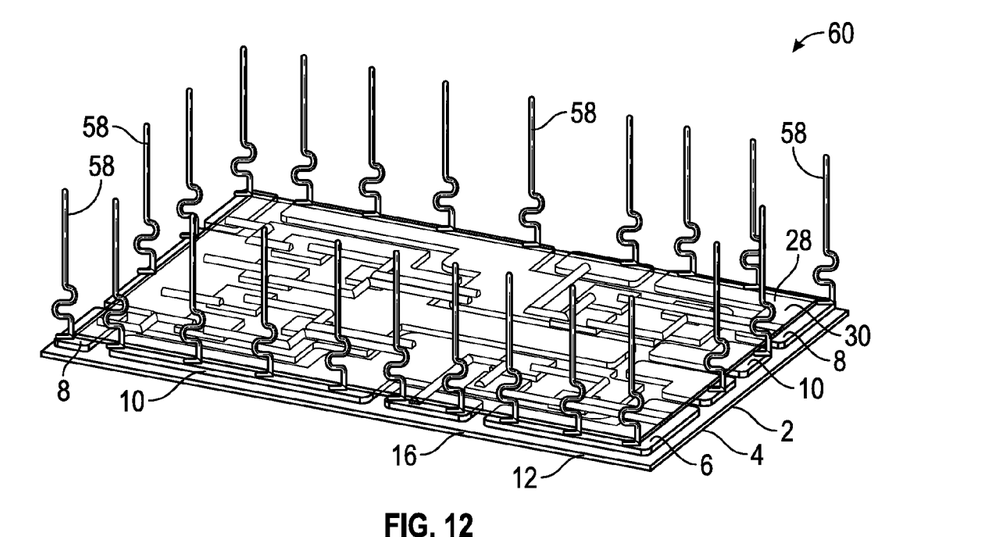
FIG. 12 is a perspective, partial see-through view of the assembly of FIG. 11 with terminal pins coupled thereto.
Figure 13:
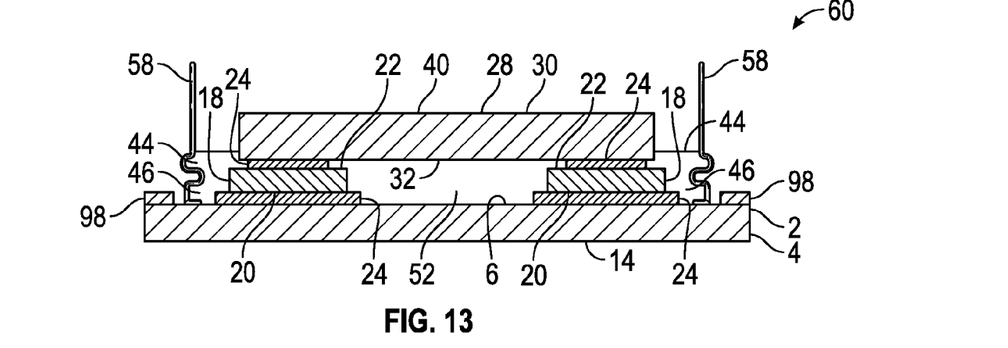
FIG. 13 is a side cross-section view of an implementation of a power semiconductor package.
Figure 14:
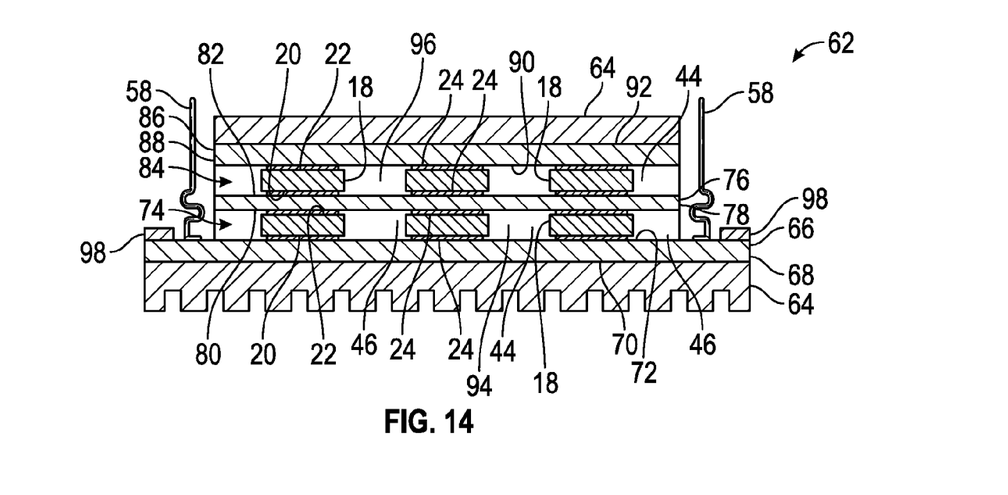
FIG. 14 is a side cross-section view of an implementation of a stacked power semiconductor package.

Referring now to FIGS. 12-14, a power semiconductor package (package) 60 and a stacked power semiconductor package (package) 62 are shown. In various implementations, packages 60, 62 may include die 18 that are non-power semiconductor die. When the die 18 include power semiconductor die they may be, by non-limiting example, power metal-oxide-semiconductor field-effect transistors (power MOSFETs), insulated-gate bipolar transistors (IGBTs), and the like. In implementations each of the packages 60, 62 includes or is a power module such as, by non-limiting example, a power integrated module (PIM).

Figure 1:
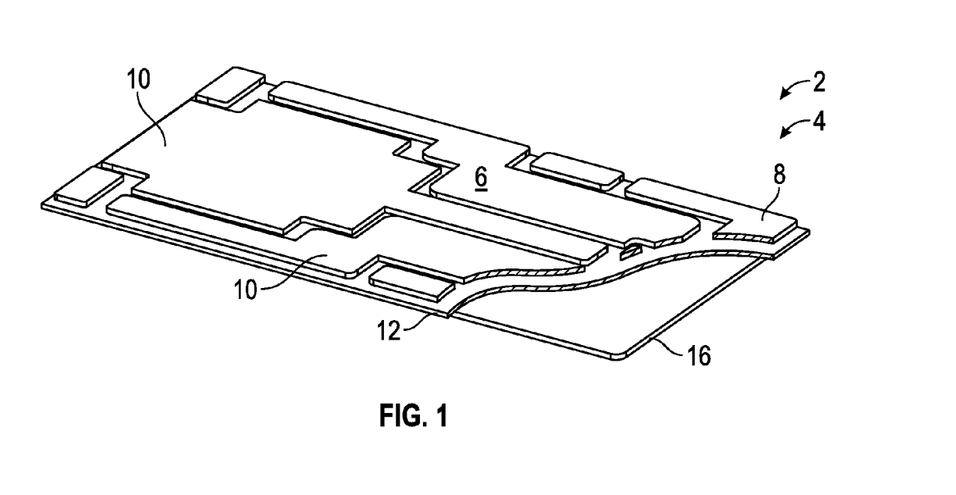
FIG. 1 is a perspective, partial cutaway view of a first direct bonded copper (DBC) substrate of an implementation of a power semiconductor package.

Referring now to FIG. 1, in implementations a package 60, 62 includes a direct bonded copper (DBC) substrate 2. The DBC substrate shown in FIG. 1 is a double-sided DBC substrate (DBC substrate) 4 which includes a ceramic plate 12 sandwiched between a first copper layer 8 and a second copper layer 16. The first copper layer 8 includes connection traces 10. A first face 6 of the DBC substrate 4 may thus be used for interconnecting electrical contacts on one or more die 18 with one another and/or with other components internal or external to the package 60, 62, while a second face 14 of the DBC substrate 4, seen in FIGS. 9-10 and 13, may be used as a heat sink and/or may be coupled to a heat sink or spreader to assist in drawing heat away from one or more die 18 of the package 60, 62 and/or used as an electrical ground. In particular implementations, the DBC substrate 2 could include only a single copper layer, which in most cases would be the layer having connection traces, though the second copper layer 16 will improve heat transfer away from die 18 of the package 60, 62.

Figure 2:
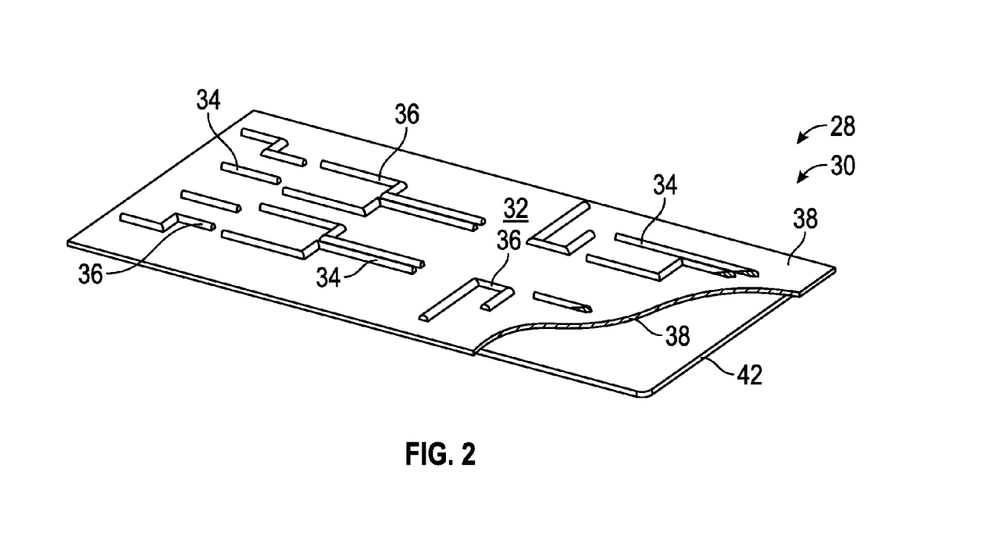
FIG. 2 is a perspective, partial cutaway view of a second DBC substrate of an implementation of a power semiconductor package.

Referring now to FIG. 2, in various implementations, a package 60, 62 includes another direct bonded copper (DBC) substrate 28, which may be a double-sided DBC substrate (DBC substrate) 30. A first copper layer 34 on a first face 32 of the DBC substrate 30 includes connection traces 36. A ceramic plate 38 is sandwiched between the first copper layer 34 and a second copper layer 42. The first and second copper layers may have similar properties and functions to those described above with respect to the similarly named layers of the DBC substrate 2. A first face 32 of the DBC substrate 30 thus may be used for interconnecting electrical contacts on one or more die 18 with one another and/or with other components internal or external to the package 60, 62, while a second face 40 of the DBC substrate 28, seen in FIGS. 9-10 and 13, may be used as a heat sink and/or for connection to a heat sink or spreader to assist in drawing heat away from one or more die 18 of the package 60, 62. In implementations the DBC substrate 28 could include only a single copper layer—which in most cases would be the layer having connection traces, though the second copper layer 42 may improve heat transfer away from die of the package 60, 62.

Figure 3:
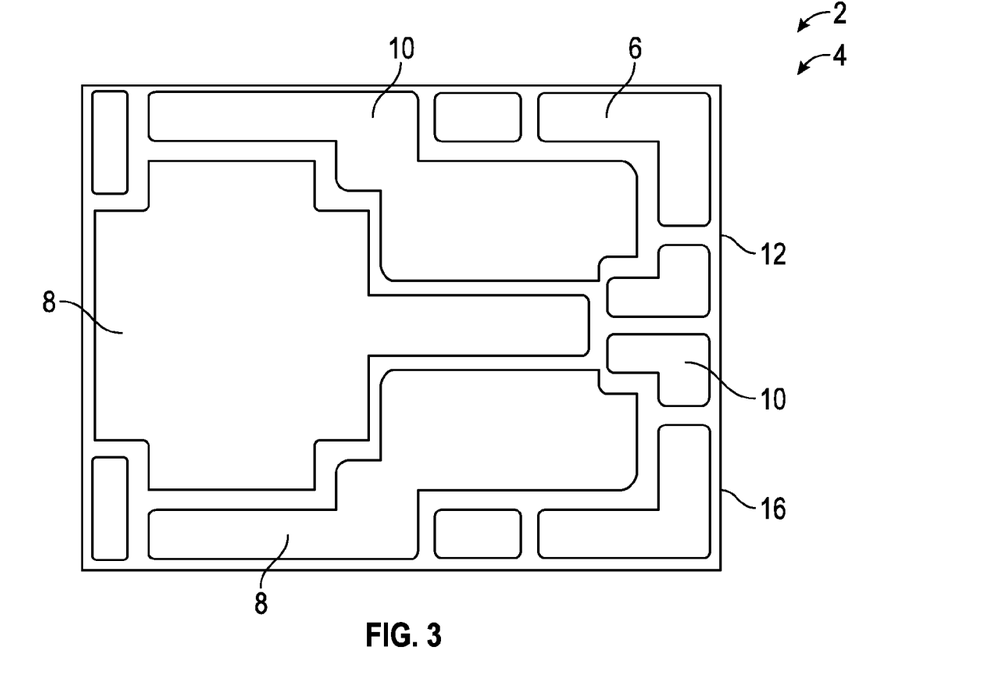
FIG. 3 is a top view of the DBC substrate of FIG. 1.
Figure 4:
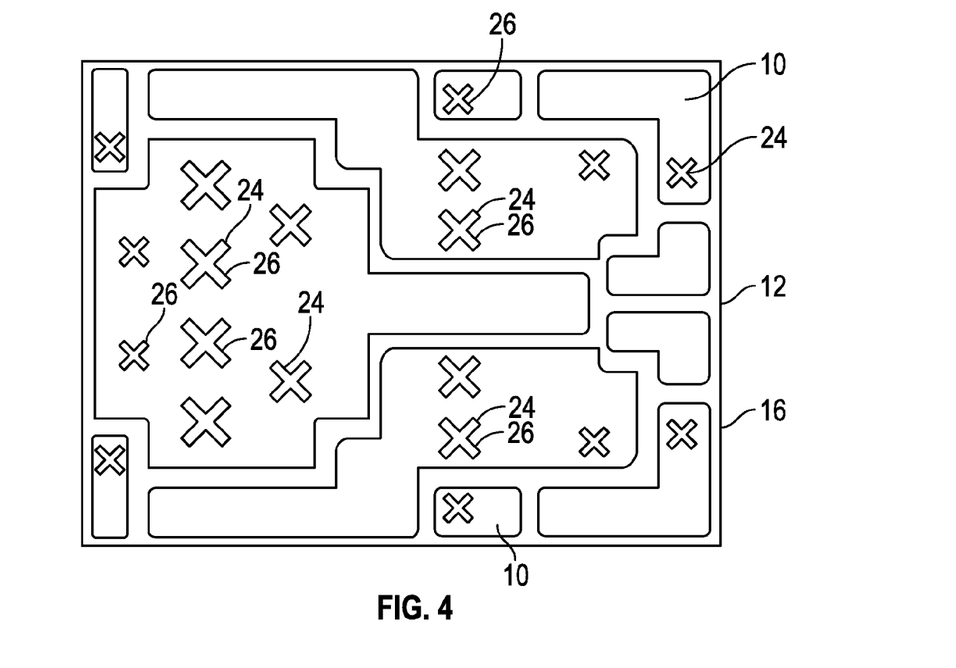
FIG. 4 is a top view of the DBC substrate of FIG. 3 with sintering paste thereon.

Both the DBC substrate 2 and DBC substrate 28 are used in the formation of packages 60, 62. Referring to FIGS. 3-4, a conductive bonding element 24 is deposited onto connection traces 10 of the first face 6 of DBC substrate 2. In implementations conductive bonding element 24 may be any high temperature bonding element that is electrically and/or thermally conductive. In implementations conductive bonding element 24 is a sintering paste 26, such as by non-limiting example a silver sintering paste. In various implementations a hybrid silver sintering paste may be used which includes other conductive metallic or non-metallic elements capable of transferring heat and/or electricity. In particular implementations, the sintering paste may not include silver at all, but may be composed of metallic and/or non-metallic component(s) which are capable of transferring heat and/or electricity. Examples of non-metallic components which could be used in various implementations include graphene. Various metals and other components of sintering pastes may be selected depending upon the characteristics of the material of the particular substrates being used. In other implementations a different material may be used, such as a conductive high temperature glue, a solder paste, solder preforms, and so forth. A representative example of a sintering paste which could be used is a silver sintering paste sold under the trade name LOCTITE ABLESTIK SSP 2020 by Henkel AG & Company, KGaA of Düsseldorf, Germany.

While the sintering paste 26 shown in FIG. 4 is formed into x-shapes, this is only a representative example and each deposition of the conductive bonding element 24 could take on any of a variety of shapes, including: a circle, a square, and any other regular or irregular open or closed shape with or without rounded corners (where applicable) or with or without corners at all. Likewise, the size of each deposition of the conductive bonding element 24 may vary according to the size of die which will be placed thereon, and may be smaller than or larger than the face of the die that will be attached thereto.

Figure 5:
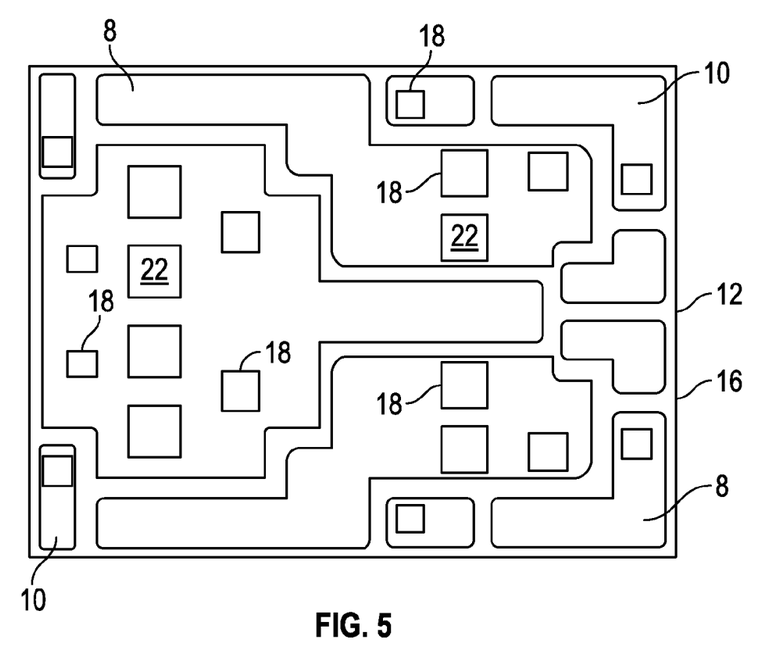
FIG. 5 is a top view of the DBC substrate of FIG. 4 with a plurality of die attached thereto.

Referring now to FIG. 5, a plurality of die 18 is attached to the DBC substrate 2 using the conductive bonding element 24. In various implementations, each die 18 is a power semiconductor die such as a power MOSFET, an IGBT, and the like. In other implementations one or more or all of the die 18 may be die that are not designed to perform power handling functions (non-power die).

While the figures show the conductive bonding element 24 being deposited onto the DBC substrate 2 first and the die 18 then placed thereon in the locations of the conductive bonding element 24, the conductive bonding element 24 could instead be deposited onto each die 18 and then each die 18 could be attached to the DBC substrate 2. In the examples shown in the figures the DBC substrate 2 includes relatively wider connection traces than those of the DBC substrate 28. This may assist the DBC substrate 2 in playing a larger role in the transfer of heat away from the die 18 than DBC substrate 28, with the wider connection traces 10 providing superior heat transfer than the thinner connection traces 36.

Figure 9:
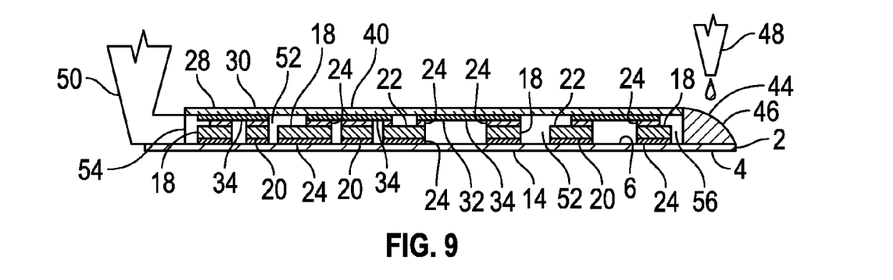
FIG. 9 is a side cross-section view of the assembly of FIG. 8 prior to filling a cavity of the assembly with an encapsulating compound.
Figure 10:
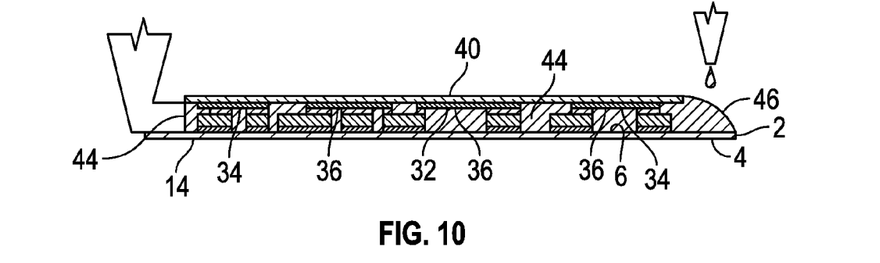
FIG. 10 is a side cross-section view of the assembly of FIG. 9 after filling a cavity of the assembly with an encapsulating compound.

As can be seen in FIGS. 9-10 and 13, the connection traces 10 are bonded to a first face 20 of the die 18. The first face 20 is the back side of the die which either does not include electrical contacts or which includes only electrical contact(s) intended to be used for grounding. Accordingly, the connection traces 10 can generally be wider as it is generally not required that multiple electrical contacts on the first face 20 be electrically routed to different locations. In some implementations there is only a single metal contact on first face 20, such as a metal pad which makes up most of the first face 20. In implementations the metal pad has a larger size than the electrical contacts on the second face 22 because the pad is intended for heat transfer in addition to any electrical coupling. DBC substrate 2 thus may be used to couple the die 18 to electrical ground for those die which have an electrical contact on the back side intended to be connected to ground, and for all of the die 18 the DBC substrate 2 may assist in heat transfer away from the back side of the die 18 through the conductive bonding element 24 and through the DBC substrate 2.

Figure 6:
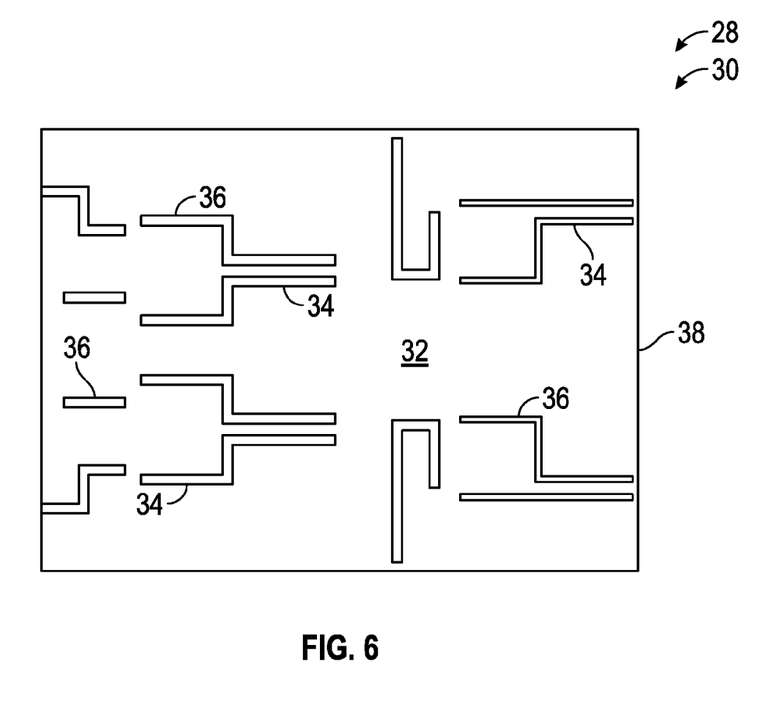
FIG. 6 it a top view of the DBC substrate of FIG. 2.
Figure 7:
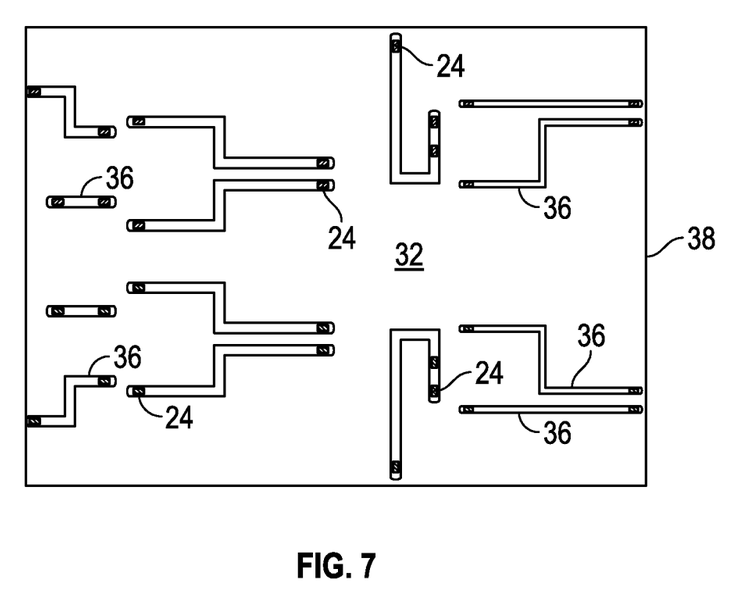
FIG. 7 is a top view of the DBC substrate of FIG. 6 with sintering paste thereon.

Referring now to FIGS. 6-7, conductive bonding element 24 is deposited onto connection traces 36 of the first face 32 of DBC substrate 28. The sintering paste 26 shown in FIG. 7 is formed into rectangular shapes, but this is only a representative example and each deposition of the conductive bonding element 24 could take on one of a variety of forms including: a circle, a square, and any other regular or irregular open or closed shape with or without rounded corners (where applicable) or with or without corners at all. Likewise, the size of each deposition of the conductive bonding element 24 may vary according to the size of an electrical contact of the die 18 to which it will be bonded.

Figure 8:
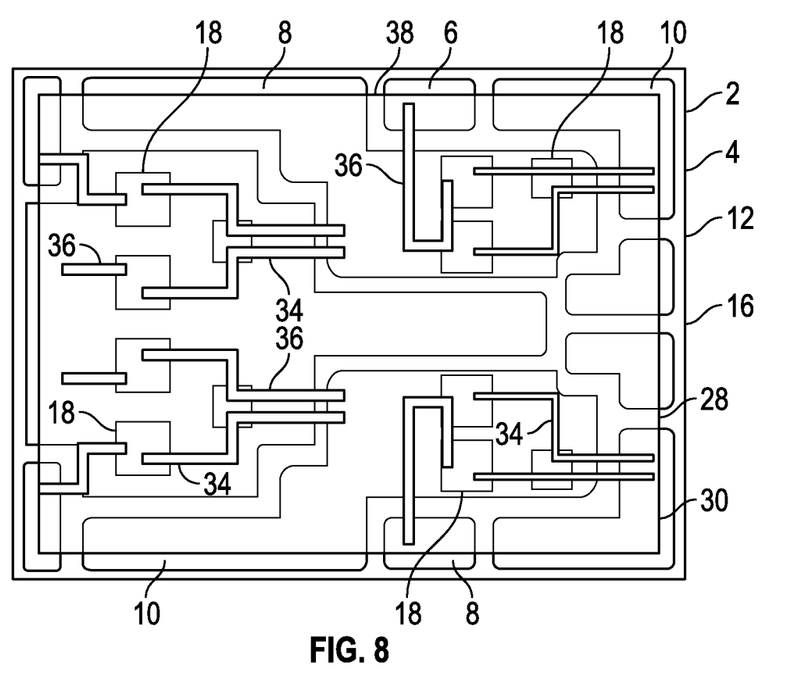
FIG. 8 is a top, partial see-through view of the DBC substrate of FIG. 7 coupled to the DBC substrate of FIG. 5.

Referring now to FIG. 8, the second face 22 of each die 18, which is on an opposite side of the die 18 from the first face 20, is attached to the DBC substrate 28 with the conductive bonding element 24. In FIG. 8 a simplified see-through illustration of DBC substrate 28 is used, which shows the ceramic plate 38 in see-through and which does not show the second copper layer 42, in order to more clearly show the other elements of FIG. 8—though the elements not shown are nevertheless present in the representative example. There are one or more electrical contacts on the second face 22 of each die 18. The second face 22 of the die is the top side of the die or, in other words, the side on which there are one or more electrical contacts which are not intended to be connected solely to ground (I/O, power, signal, etc.). While the electrical contacts on the second face 22 of the die 18 are not shown in the drawings, the practitioner of ordinary skill in the art will readily understand from FIG. 8 how each connection trace 36 contacts one or more electrical contacts on a second face 22 of one of the die and electrically couples the one or more electrical contacts of that die 18 with one or more electrical contacts of another die 18 and/or with one or more of the connection traces 10 of DBC substrate 2 (such as to connect it to ground).

It may also be realized from FIG. 8 that for some of the connection traces 36 there may need to be larger amounts of the conductive bonding element 24 applied to portions of the connection traces 36 and less to other portions of the connection traces 36. For packages having connection traces 36 which are connected to one or more die 18 and which are also connected to one or more connection traces 10 of DBC substrate 2, for example, the portions of those connection traces 36 coupled to the connection traces 10 may need more of the conductive bonding element 24 as there will be a greater gap between the connection trace 36 and the connection trace 10 than there will be between the connection traces 36 and the die 18, assuming all the connection traces 10 and 36 are, respectively, of substantially uniform thickness.

In other implementations the connection traces 10 and/or the connection traces 36 may be of varying thicknesses, such as through selective etching to decrease the thickness in desired areas, so that the gaps between the connection traces 36 and connection traces 10 which will be filled with the conductive bonding element 24 will be closer to the size of, or about the same size as, or the same size as, the gaps between the connection traces 36 and die 18 that will be filled with the conductive bonding element 24. In implementations DBC substrates discussed herein may include any of the features, characteristics, and properties of DBC substrates—such as ceramic layers of varying thickness, copper layers of varying thickness, and the like—disclosed in U.S. Utility application Ser. No. 14/534,482, filed Nov. 6, 2014, listing as first inventor Yusheng Lin, titled "Substrate Structures and Methods of Manufacture" (hereinafter the '482 Application), the disclosure of which is entirely incorporated herein by reference. By non-limiting example, it may be desirable that some connection traces 36 be thinner for finer interconnections between electrical contacts of the die while it may be desirable that others be thicker for greater heat transfer properties, and any of the methods disclosed in the '482 Application for forming connection traces of varying thickness may be used to accomplish this.

In some implementations of semiconductor packages none of the connection traces 36 will couple to the connection traces 10, but will instead only interconnect electrical contacts on the second faces 22 of the die 18 with one another and/or with other elements external to the package.

While the figures show an example of the conductive bonding element 24 being deposited onto the connection traces 36 and the DBC substrate 28 then being coupled to the die 18, the conductive bonding element 24 could instead be deposited onto each die 18 and then the DBC substrate 28 coupled to the die 18. In the examples shown in the figures the DBC substrate 28 includes relatively thinner connection traces than those of the DBC substrate 2. This may allow the connection traces 36 to be used for finer interconnections between electrical contacts on the die 18. As can be seen in FIGS. 9-10 and 13, the DBC substrate 28 is bonded to a second face 22 of the die 18. The second face 22 of any single die 18 may have multiple electrical contacts which need to be routed and/or interconnected to different elements in order for the proper function or performance of die 18 and the package 60, 62. Wider connection traces may thus not be as useful for DBC substrate 28 as they may not be as useful for finer electrical routing purposes. Nevertheless, as indicated above, there may be some connection traces 36 which may be thicker, or which may be thicker in some places, to provide greater heat transfer and/or for the reasons otherwise disclosed herein. Similarly, the connection traces 36 need not all be the same width and greater widths may be used in some places where the greater width will not create difficulties in routing the electrical contacts of the second faces 22.

In implementations there may be multiple steps in applying and/or curing or otherwise completing or strengthening the bond of conductive bonding element 24 with the various elements. When a sintering paste 26 is used the sintering paste 26 may be applied to the DBC substrate 2 using a stencil and/or syringe, and the sintering paste 26 may then be dried in air for several minutes such as in an oven at around 120 degrees Celsius. The die 18 may then be placed on the sintering paste 26 at this same temperature and/or the temperature may be increased to perform a snap cure of the sintering paste 26. A second layer of sintering paste 26 may be deposited onto connection traces 36, and allowed to dry in air as with the first layer of sintering paste 26, and then DBC substrate 28 may be placed on die 18 and a snap cure performed to form an initial bond between the two. After this a sintering step may be performed to sinter the sintering paste 26 and achieve stronger bonds between the elements coupled with sintering paste 26.

In some implementations there could be multiple sintering steps, such as a first sintering step to sinter the first layer of sintering paste 26 atop the DBC substrate 2 and a second sintering step to sinter the second layer of sintering paste 26 atop the DBC substrate 28. In some implementations there could be only one sintering step, so that there is a step of applying sintering paste 26 to DBC substrate 2, a drying step for the sintering paste 26 applied to DBC substrate 2, a step of placing the die 18 onto DBC substrate 2, a snap cure of the sintering paste 26 applied to the DBC substrate 2 to form an initial bond between DBC substrate 2 and the die 18, an application of sintering paste 26 to DBC substrate 28, a drying step for the sintering paste 26 applied to DBC substrate 28, a snap cure of sintering paste 26 applied to DBC substrate 28 to form an initial bond between the sintering paste 26 and DBC substrate 28, placement of the DBC substrate 28 onto the die 18, and then a single sintering step to sinter the sintering paste 26 between the die 18 and DBC substrate 2 as well as the sintering paste 26 between the die 18 and DBC substrate 28.

During the sintering step pressure is applied downwards on DBC substrate 28 (and/or upwards on DBC substrate 2) and the temperature is increased to cause the sintering of the sintering paste 26. The sintering pressure may be applied such as using a pressure plate and may, by non-limiting example, apply pressures ranging between 10-30 megaPascals (MPa). The sintering temperature may be, or may be about, 230 degrees Celsius. The times for these various steps may be, by non-limiting example, about ten minutes for each drying step, less than a second or tens of milliseconds (such as 50 ms) for the placement of the die or DBC substrate(s) atop other element(s), 1-5 minutes for the snap cure steps, and 1-2 minutes for the sintering step(s). In some implementations the drying step(s) may be omitted.

DBC substrates 2 and 28 are shown in FIGS. 9-10. For ease of viewing not all of the sub-elements of the DBC substrates are shown—for instance the first copper layer 34 of DBC substrate 28, having the connection traces 36, is shown, but the individual ceramic plates of the DBC substrates and the other copper layers are not drawn individually, though they are present in the DBC substrates. Similar simplified illustrations of DBC substrates are used in FIGS. 11-14, in which some but not all of the DBC substrate sub-elements are shown and in which some of the elements are shown in see-through, for clarity in seeing the other components. Each of the DBC substrates in these figures nevertheless are double-sided DBC substrates having a ceramic plate sandwiched between two copper layers, although not all of the sub-elements are shown.

When the DBC substrates 2, 28 are coupled to the die 18 as disclosed herein, such as using the sintering process described herein, cavity 52 is formed between DBC substrate 2 and DBC substrate 28. Cavity 52 is later filled with an encapsulating compound 44. The encapsulating compound 44 isolates and/or protects the die 18 and other elements of packages 60, 62 from, by non-limiting example, shock, vibration, moisture, corrosive agents, and the like. Encapsulating compound 44 may be an epoxy, an underfill material, a thermosetting polymer, a silicone gel 46, polyurethane, a low glass transition temperature potting compound, and the like.

In the representative examples shown in the drawings the encapsulating compound 44 is a silicone gel 46 and is introduced into the cavity 52 using an under fill process. A vacuum 50 is placed at a first end 54 of the cavity 52 and a dispenser 48 dispenses silicone gel 46 at a second end 56 of the cavity 52, as shown in FIG. 9. The silicone gel 46 moves towards the first end 54 of the cavity 52 from the second end 56 using capillary flow action assisted by the vacuum 50. The DBC substrate 2 and/or DBC substrate 28 may be heated to improve the flow characteristics of the silicone gel 46 during the filling process. The vacuum 50 assists in drawing the silicone gel 46 from the second end 56 towards the first end 54 to fill the cavity 52, as shown in FIG. 10, and helps to dispense the silicone gel 46 through narrow crevices between DBC substrates 2 and 28, die 18, and so forth. Similar techniques are used in the industry with flip chip packaging. More than one dispenser 48 and more than one vacuum 50 may be used during this process, and each may be placed at an appropriate location to achieve desired placement of the silicone gel 46 throughout the cavity 52 to completely fill it. Thus in implementations conventional vertical gel-dispense techniques may not be needed. Conventional vertical gel-dispensing techniques may include vertical dispensing such as with a dispenser sold under the trade name DISPENSING CELL SD-DM 402/403 by Sonderhoff Chemicals GmbH of Köln, Germany.

Other dispensing techniques that are known in the art and hereafter discovered may be used to fill cavity 52 with an encapsulating compound 44 including epoxy underfill and other capillary action processes. In particular implementations, no-flow underfill processes could be used.

Encapsulating compounds 44 that are polymers, such as silicone gel 46, may undergo a curing process after being applied in order to develop desired encapsulation properties. This may involve one or more or all of: the application of heat, the application of humidity, the application of ultraviolet light, the presence of a catalyst, and/or the presence of a crosslinker to link individual polymer chains together. In implementations encapsulating compound 44 may be or may include one or more of the following products: a dielectric gel sold under the trade name DOW CORNING EG-3810 DIELECTRIC GEL by Dow Corning Corporation of Midland, Mich.; a dielectric gel sold under the trade name DOW CORNING EG-3896 KIT by Dow Corning Corporation; a dielectric gel sold under the trade name SYLGARD 527 A&B SILICONE DIELECTRIC GEL by Dow Corning Corporation; a silicone gel sold under the trade name WACKER SILGEL 612 AB by Wacker Chemie AG of Munchen, Germany; and the like. Specification sheets for these four representative examples are attached herewith as Appendices A-D, the contents of each of which are hereby incorporated entirely herein by reference, and the encapsulating compound 44 may have any of the properties disclosed in Appendices A-D, and may likewise be applied, cured, and otherwise prepared as disclosed in those documents, such as using any of the cure temperatures and times disclosed therein, using any two-part gel systems disclosed therein, and the like.

Figure 11:
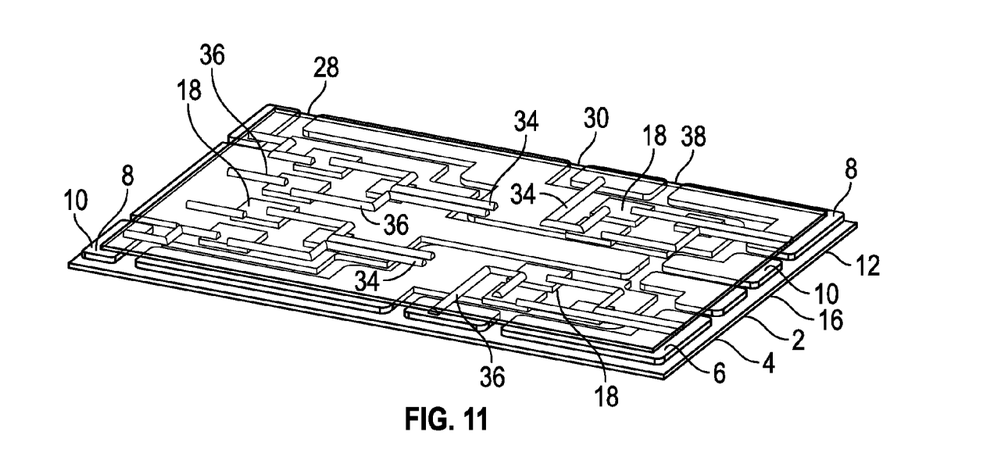
FIG. 11 is a perspective, partial see-through view of the assembly of FIG. 8.

FIG. 11 is a representation of the configuration of DBC substrates 2, 28 after the encapsulating compound 44 has been applied and, when applicable, cured. The encapsulating compound 44 is not shown in FIG. 11, and the second copper layer 42 is also not shown, while the ceramic plate 38 is shown in see-through to show the other elements clearly. In implementations some or all of the connection traces 10 remain exposed after the application and/or curing of the encapsulating compound. Referring to FIG. 12, terminal pins 58 are coupled to the connection traces 10 in places where the connection traces are exposed, such as by soldering, or binding with a conductive adhesive, and so forth. In FIG. 12 the encapsulating compound 44 is again not shown, the second copper layer 42 is not shown, and the ceramic plate 12 is again shown in see-through to show the other components. In implementations the terminal pins 58 could be coupled to the connection traces 10 prior to the encapsulation process and in such implementations it would be unnecessary to leave any of the connection traces 10 exposed after the encapsulation process.

In the examples shown in FIGS. 10-13 the terminal pins 58 are coupled only at the connection traces 10. In such implementations one or more of the connection traces 10 may not be coupled to electrical ground but may instead provide power to the die 18, and accordingly may be coupled to the second faces 22 of the die 18 through one or more connection traces 36. In other implementations one or more of the terminal pins 58 could be coupled directly to one or more connection traces 36 such as to provide power to the die 18. In such implementations there may be portions of the connection traces 36 left exposed after the encapsulation process to facilitate coupling of the terminal pins 58 thereto, or the terminal pins 58 may be coupled with the connection traces 36 prior to the encapsulation process in which case the connection traces 36 may be fully encapsulated with no portions exposed.

FIG. 13 is a simplified cross section view representative of package 60 of FIG. 12. DBC substrates 2 and 28 are both shown in simplified form again, wherein none of the sublayers are pointed out, though DBC substrates 2 and 28 in FIG. 13 are both double-sided DBC substrates with a ceramic plate sandwiched between two copper layers, one copper layer of each DBC substrate including connection traces. DBC substrate 2 in FIG. 13 is shown coupled to the first faces 20 of two die 18 with conductive bonding element 24, and the second faces 22 of the die 18 are coupled to the DBC substrate 28 with conductive bonding element 24. Naturally the locations where the die 18 couple to the DBC substrates 2 and 28 will correspond with the connection traces 10 and 36 as previously discussed. Encapsulating compound 44 fills the cavity 52 between the DBC substrates 2 and 28. Terminal pins 58 are coupled to connection traces 10 of DBC substrate 2.

A connector 98 has been added to DBC substrate 2, which is configured to assist in coupling an additional casing to the package 60. Connector 98 may thus be a screw receiver, a snap-fit element, a friction-fit element, an adhesive element, or the like, to allow a casing to be coupled to package 60. The casing may be a polymer casing and may have through-holes to allow terminal pins 58 to extend through a sidewall of the casing, while the rest of package 60 may be substantially housed within a cavity of the casing. In FIG. 13 the encapsulating compound 44 is shown extending all the way to the terminal pins 58, though in other implementations it may cover and protect the die but may not extend all the way to the terminal pins 58.

FIG. 14 shows a cross-section view of an example of a stacked power semiconductor package 62 and is a representative example of how DBC substrates as disclosed herein may be used to stack several layers of die 18. The DBC substrates are again shown in simplified form. DBC substrate 66, which is a double-sided DBC substrate (DBC substrate) 68, includes a ceramic plate sandwiched between a copper layer on a first face 70 and a copper layer on a second face 72, though the ceramic plate and copper layers are not explicitly shown—the ceramic plate and copper layers instead being drawn as a single substrate layer but may be arranged like any DBC substrate disclosed herein. The copper layer on the second face 72 includes connection traces. In other implementations DBC substrate 66 could have only a single copper layer on the side that faces the die 18. DBC substrate 66 is shown coupled to the first faces 20 of a first plurality 74 of die 18 with conductive bonding element 24. A DBC substrate 76 is coupled to the second faces 22 of the first plurality 74 of die 18 with conductive bonding element 24.

While DBC substrate 76 is also shown in simplified format, it is a double-sided DBC substrate (DBC substrate) 78 with a ceramic plate sandwiched between two copper layers. DBC substrate 76 differs from DBC substrate 66 in that both of the copper layers of DBC substrate 76 will have connection traces, while DBC substrate 66 may only have connection traces on the side that faces the die 18. Thus the second faces 22 are coupled to connection traces of a copper layer on a first face 80 of DBC substrate 76 and the first faces 20 of a second plurality 84 of die 18 are coupled to connection traces of a copper layer on a second face 82 of DBC substrate 76 using conductive bonding element 24.

This process may be repeated a desired number of times for stacking to a desired height, with each intermediate DBC substrate being a DBC substrate which has connection traces in both copper layers. A top DBC substrate may be used atop the final layer of die 18, and the top DBC substrate will generally need connection traces in only one of the copper layers (and in some implementations it may have only a single copper layer) which faces the die 18. In FIG. 14 the connection traces in the bottom copper layer of DBC substrate 86 are coupled to the second faces 22 of the second plurality 84 of die 18 using conductive bonding element 24. DBC substrate is a double-sided DBC substrate (DBC substrate) 88 and includes connection traces in a copper layer of a first face 90 of the DBC substrate 86. In the representative example the copper layer at a second face 92 of the DBC substrate 86 is a flat copper sheet with no connection traces. DBC substrate 86 is drawn in simplified form in FIG. 14, so that although it has a ceramic layer sandwiched between two copper layers, all these layers are simply drawn as a single substrate.

Referring still to FIG. 14, terminal pins 58 are added, an encapsulating compound 44 is used to fill cavities between the various DBC substrate layers and to provide protection as discussed herein, and connectors 98 are added for coupling to a casing, as described herein with respect to other packages. In the representative example in which there are two layers or pluralities of die 18 sandwiched between three DBC substrates, a first cavity 94 between DBC substrates 66 and 76 is filled with encapsulating compound 44 and a second cavity 96 between DBC substrates 76 and 86 is also filled with encapsulating compound 44. Methods such as those described elsewhere herein may be used to fill the first cavity 94 and second cavity 96 with the encapsulating compound 44. Heat sinks 64 may be coupled to the top and bottom DBC substrates for further heat transfer and spreading. Heat sinks 64 may be attached using a solder, an adhesive, and the like. Heat sinks 64 may also be coupled to the top and/or bottom DBC substrate(s) in any of the other packages discussed herein.

Figure 15:
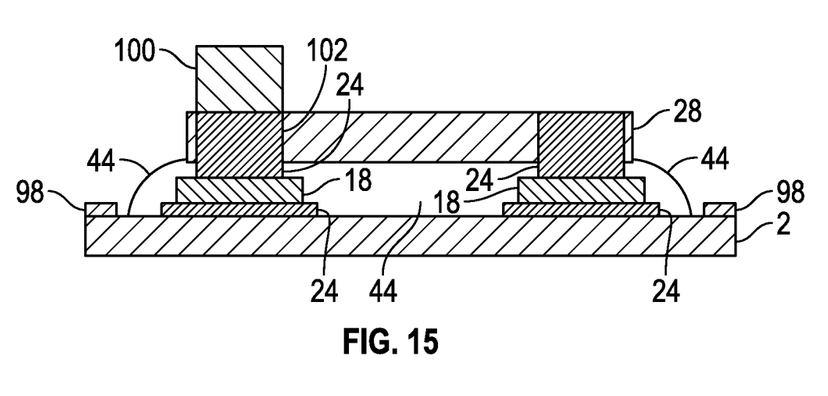
FIG. 15 is a side cross-section view of an implementation of a power semiconductor package.

Referring to FIG. 15, in particular implementations, one or more or all of the terminal pins 58 may be omitted and instead pins 100 may be coupled to contacts on the second faces 22 of the die 18 using conductive bonding element 24. In the package shown in FIG. 15, the leftmost conductive bonding element 24 coupled to the pin 100 is formed into a pillar or column 102 and extends upwards through a through-hole or opening in DBC substrate 28. Column 102 may be in the form of a cylindrical shape or it may take on other cross-sectional regular or irregular closed shape. Pin 100 may likewise by cylindrical or it may have any other cross-sectional regular or irregular closed shape. Pin 100 couples to the column 102 and is formed of a conductive metal such as, by non-limiting example, copper, aluminum, nickel, and any other metal alloy or electrically conductive and/or metal-containing material. The leftmost column 102 is seen with a pin 100 atop it while the rightmost column 102 does not have a pin 100 atop it, and may instead act as a conductive pad for contacting with some other element. These are intended to be representative of variability in configurations, as some columns 102 in any given package may be topped with a pin 100 while other columns 102 of the same package are not topped with a pin 100 as desired. Encapsulating compound 44 is used, as shown in the figure.

FIG. 15 is a simplified representation—while there are no connections shown between DBC substrate 2 and DBC substrate 28 except through the die 18, such connections may nevertheless exist in portions of the package as described previously with respect to FIG. 8, so that DBC substrate 2 could actually be grounded through a pin 100 by virtue of coupling of the pin 100 to an electrical ground and to the DBC substrate 2 through interconnects. Although each die 18 shown in FIG. 18 is shown with a column 102 of conductive bonding element 24 atop it, some of the second faces 22 of the die 18 may instead be coupled only to connection traces 36, similar to the die 18 shown in FIG. 13. Additionally, though the DBC substrates 2 and 28 shown in FIG. 15 are in simplified form, in the representative example each includes a ceramic plate sandwiched between two copper layers, as described with respect to other implementations disclosed in this document.

Figure 16:
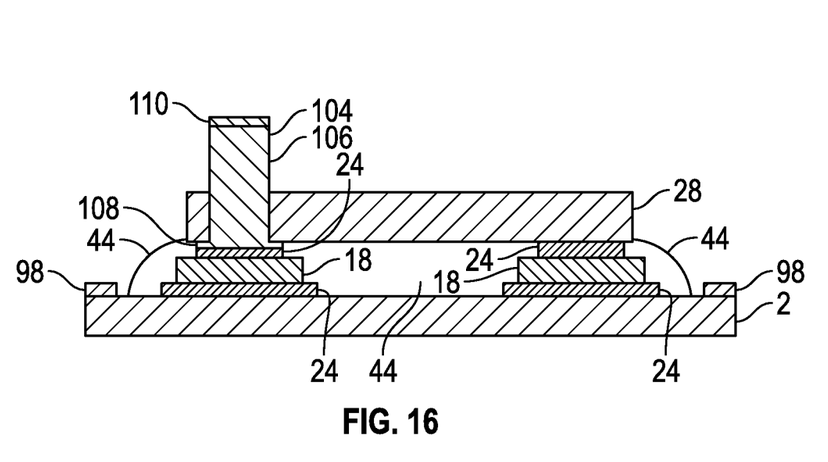
FIG. 16 is a side cross-section view of an implementation of a power semiconductor package.

Referring to FIG. 16, in implementations one or more or all of the terminal pins 58 may be omitted and instead pins 104 may be coupled to contacts on the second faces 22 of the die 18 using conductive bonding element 24. In the package shown in FIG. 16, the leftmost conductive bonding element 24 coupled to the pin 104 is not formed into a column 102 as was shown in the FIG. 15 example but instead is flat and the pin 104 itself includes a base 108 which couples to the conductive bonding element 24 and a column 106 which extends upwards and exits the DBC substrate 28 through a through hole in the DBC substrate 28. Column 106 may have a cylindrical shape or any other regular or irregular closed shape. Base 108 may be circular, rectangular, square, or have any other regular or irregular closed shape. Pin 104 is formed of a conductive metal such as, by non-limiting example, copper, aluminum, nickel, and so forth. Plating 110 may be added to the top of the column 106. By non-limiting example, in implementations the pin 104 may be formed of copper or aluminum and the plating 110 may be formed of nickel and/or tin, though other metals and/or metal alloys may be used for either. If a tin or other low-melting point plating 110 is used, the plating may be reflowed with one or more other elements to form an electrical connection as desired, such as with a printed circuit board (PCB), motherboard, power sources and/or electrical grounds, or other elements (and similar plating may be applied to pins 100 of the previous example for similar or other reasons). The leftmost die 18 is seen with a pin 104 coupled thereto while the rightmost die 18 is simply coupled to the connection traces 36 of the DBC substrate 28 using the conductive bonding element 24. These are intended to be representative of variability in configurations, as some die 18 in any given package may be topped with a pin 104 while other die 18 of the same package may instead be coupled to connection traces 36 at their second faces 22 as desired. Encapsulating compound 44 is used, as shown in the figure.

FIG. 16 is a simplified representation so that, for example, while there are no connections shown between DBC substrate 2 and DBC substrate 28 except through the die 18, such connections may nevertheless be present in portions of the package as described herein with respect to FIG. 8, so that DBC substrate 2 could actually be grounded through a pin 104 by virtue of coupling of the pin 104 to a ground and to the DBC substrate 2 through interconnections. Although the DBC substrates 2 and 28 shown in FIG. 16 are in simplified form, in the representative example each includes a ceramic plate sandwiched between two copper layers, as described with respect to other implementations disclosed in this document.

Implementations of packages may include one or more terminal pins 58, one or more pins 100 and/or one or more pins 104, and any other conductive connectors disclosed herein, in the same package.

As may be seen from the drawings and from the descriptions herein, in various implementations, packages 60, 62 include no wirebonds, and instead all of the routing is done using connection traces of one or more DBC substrates. In implementations this increases the reliability of the PIM or other semiconductor power device of the package by eliminating all the possible failure modes wirebonds present when used in a package. No conductive clips are used, in these package designs, and in such implementations the elimination of conductive clips results in eliminating failure modes caused by conductive clips. The ability to cool the die 18 on both sides using a DBC substrate on each side improves thermal performance by improving heat transfer from the die 18 and may improve the performance and/or life of the die 18 and/or package.

As may also be deduced from the drawings and the description herein, the connection traces 10 and connection traces 36 have complementary patterns inasmuch as the connection traces 10 are configured to couple to the first face 20 of each die 18 while the connection traces 36 are coupled to the second face 22 of each die 18. Likewise the connection traces on the second face 72 of DBC substrate 66 are complementary to the connection traces on the first face 80 of DBC substrate 76 inasmuch as the connection traces of the second face 72 of DBC substrate 66 are configured to couple to the first face 20 of each of the first plurality 74 of die 18 while the connection traces of the first face 80 of DBC substrate 76 are coupled to the second face 22 of each of the first plurality 74 of die 18. Likewise the connection traces on the second face 82 of DBC substrate 76 are complementary to the connection traces on the first face 90 of DBC substrate 86 inasmuch as the connection traces of the second face 82 of DBC substrate 76 are configured to couple to the first face 20 of each of the second plurality 84 of die 18 while the connection traces of the first face 90 of DBC substrate 86 are coupled to the second face 22 of each of the second plurality 84 of die 18. With stacked packages that include more than two layers of die the DBC substrates will similarly have complementary connection traces throughout.

Conventional power integrated modules (PIMs) are not double-sided cooled but instead have only a single thermal dissipation path, the path being on only one side of the package. Silver sintering paste 26 has good thermal conductivity and its use for the conductive bonding element 24 may further assist with heat transfer. Improved heat transfer due to using two or more DBC substrates for routing instead of wirebonds may be useful for power devices in automotive applications, such as those using stacked die 18, and in other applications. In general, the methods and elements disclosed herein for packages including die sandwiched between two or more DBC substrates may result in power semiconductor devices that have improved thermal properties, increased life and/or improved performance.

In places where the description above refers to particular implementations of direct bonded copper semiconductor packages and related methods and implementing components, sub-components, methods and sub-methods, it should be readily apparent that a number of modifications may be made without departing from the spirit thereof and that these implementations, implementing components, sub-components, methods and sub-methods may be applied to other direct bonded copper semiconductor packages and related methods.

What is claimed is:

1. A power semiconductor package, comprising:
a first direct bonded copper (DBC) substrate having a plurality of connection traces on a first face of the first DBC substrate;
a plurality of die, each die comprising a first face coupled to one of the connection traces of the first face of the first DBC substrate; and
a second DBC substrate having a plurality of connection traces on a first face of the second DBC substrate;
wherein a second face of each of the plurality of die is coupled to one of the connection traces of the first face of the second DBC substrate; and
wherein the connection traces on the first face of the second DBC substrate are thinner than the connection traces on the first face of the first DBC substrate.

2. The power semiconductor package of claim 1, further comprising a silicone gel encapsulating compound filling a cavity between the first face of the first DBC substrate and the first face of the second DBC substrate.

3. The power semiconductor package of claim 1, further comprising a plurality of terminal pins, each terminal pin coupled to one of the connection traces of the first face of the first DBC substrate.

4. The power semiconductor package of claim 1, wherein the first face of each die is coupled to the first face of the first DBC substrate using a sintering paste.

5. The power semiconductor package of claim 4, wherein the sintering paste is a silver sintering paste.

6. The power semiconductor package of claim 1, wherein the second face of each die is coupled to the first face of the second DBC substrate using a sintering paste.

7. The power semiconductor package of claim 6, wherein the sintering paste is a silver sintering paste.

8. The power semiconductor package of claim 1, wherein the first DBC substrate is a double-sided DBC substrate comprising a ceramic plate sandwiched between a first copper layer and a second copper layer, the first copper layer comprising the connection traces of the first DBC substrate.

9. The power semiconductor package of claim 1, wherein the second DBC substrate is a double-sided DBC substrate comprising a ceramic plate sandwiched between a first copper layer and a second copper layer, the first copper layer comprising the connection traces of the second DBC substrate.

10. The power semiconductor package of claim 1, wherein the power semiconductor package comprises no wirebonds.

11. A power semiconductor package, comprising:
a first direct bonded copper (DBC) substrate having a plurality of connection traces on a first face of the first DBC substrate;
a first plurality of die, each die comprising a first face coupled to one of the connection traces of the first face of the first DBC substrate; and
a second DBC substrate having a plurality of connection traces on a first face of the second DBC substrate and on a second face of the second DBC substrate, wherein a second face of each of the first plurality of die is coupled to one of the connection traces of the first face of the second DBC substrate;
a second plurality of die, each die comprising a first face coupled to one of the connection traces of the second face of the second DBC substrate; and
a third DBC substrate having a plurality of connection traces on a first face of the third DBC substrate, wherein a second face of each of the second plurality of die is coupled to one of the connection traces of the first face of the third DBC substrate.

12. The power semiconductor package of claim 11, further comprising an encapsulating compound filling a cavity between the first face of the first DBC substrate and the first face of the second DBC substrate, and filling a cavity between the second face of the second DBC substrate and the first face of the third DBC substrate with an encapsulating compound.

13. The power semiconductor package of claim 11, further comprising a third plurality of die, each die comprising a first face coupled with one of a plurality of connection traces of a second face of the third DBC substrate.

14. The power semiconductor package of claim 1, wherein the first face and second face of each die of the first plurality of die and the first face and second face of the each die of the second plurality of die is coupled to one of the first DBC substrate, the second DBC substrate, and the third DBC substrate using a sintering paste.

15. The power semiconductor package of claim 14, wherein the sintering paste is a silver sintering paste.

16. The power semiconductor package of claim 11, wherein the first DBC substrate is a double-sided DBC substrate comprising a ceramic plate sandwiched between a first copper layer and a second copper layer.

17. The power semiconductor package of claim 11, wherein the second DBC substrate is a double-sided DBC substrate comprising a ceramic plate sandwiched between a first copper layer and a second copper layer.

18. The power semiconductor package of claim 11, wherein the third DBC substrate is a double-sided DBC substrate comprising a ceramic plate sandwiched between a first copper layer and a second copper layer.

19. The power semiconductor package of claim 11, wherein the power semiconductor package comprises no wirebonds.

* * * * *